(12) United States Patent
Hose et al.

(10) Patent No.: US 8,629,488 B2
(45) Date of Patent: Jan. 14, 2014

(54) METHOD FOR MANUFACTURING AN ENERGY STORAGE DEVICE AND STRUCTURE THEREFOR

(75) Inventors: Sallie Hose, Gresham, OR (US); Derryl Allman, Camas, WA (US); Peter A. Burke, Portland, OR (US); Ponce Saopraseuth, Happy Valley, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1518 days.

(21) Appl. No.: 12/108,361

(22) Filed: Apr. 23, 2008

(65) Prior Publication Data

US 2009/0267187 A1    Oct. 29, 2009

(51) Int. Cl.
*G11C 11/00* (2006.01)

(52) U.S. Cl.
USPC ............... 257/296; 257/516; 257/E25.001; 349/38; 349/39; 349/140; 361/328; 361/303; 361/304; 361/309; 361/306.1

(58) Field of Classification Search
USPC ............. 257/516, 296, E25.001; 349/38, 39, 349/140; 361/328, 303, 304, 309, 306.1, 361/311–313, 330
See application file for complete search history.

(56) References Cited

U.S. PATENT DOCUMENTS

| | | | | |
|---|---|---|---|---|
| 6,780,750 B2 * | 8/2004 | Yang | ............................. | 438/612 |
| 7,301,752 B2 * | 11/2007 | Coolbaugh et al. | ........... | 361/328 |
| 7,317,230 B2 * | 1/2008 | Lee et al. | ...................... | 257/401 |
| 7,796,201 B2 * | 9/2010 | Yen | ................................. | 349/38 |

* cited by examiner

*Primary Examiner* — Michael Shingleton
(74) *Attorney, Agent, or Firm* — Rennie William Dover

(57) ABSTRACT

An energy storage device such as a metal-insulator-metal capacitor and a method for manufacturing the energy storage device. The metal-insulator-metal capacitor includes an insulating material positioned between a bottom electrode or bottom plate and a top electrode or top plate. The surface area of the bottom electrode is greater than the surface area of the insulating material and the surface area of the insulating material is greater than the surface area of the top electrode. The top electrode and the insulating layer have edges that are laterally within and spaced apart from edges of the bottom electrode. A protective layer covers the top electrode, the edges of the top electrode, and the portions of the insulating layer that are uncovered by the top electrode. The protective layer serves as an etch mask during the formation of the bottom electrode.

17 Claims, 3 Drawing Sheets

METHOD FOR MANUFACTURING AN ENERGY STORAGE DEVICE AND STRUCTURE THEREFOR

TECHNICAL FIELD

The present invention relates, in general, to semiconductor components and, more particularly, to semiconductor components that include one or more energy storage devices such as, for example, metal-insulator-metal capacitors.

BACKGROUND

Semiconductor component manufacturers are constantly striving to increase the functionality and performance of their products, while decreasing their cost of manufacture. One approach for increasing functionality and performance has been to increase the number of circuit elements manufactured from a semiconductor wafer. As those skilled in the art are aware, a semiconductor wafer is divided into a plurality of areas or regions called chips or dice. Identical circuit elements are manufactured in each chip. Increasing the number of chips in a semiconductor wafer lowers the cost of manufacturing semiconductor components. A drawback with manufacturing or integrating a large number of circuit elements in a semiconductor wafer is that it increases the area occupied by each chip and thereby decreases the number of chips that can be manufactured from a single semiconductor wafer. Manufacturing passive circuit elements from a semiconductor substrate uses a large portion of the semiconductor substrate. Integrating passive circuit elements with active circuit elements further increases the chip size because of the sizes of the passive circuit elements. Integration of active and passive circuit elements also complicates the manufacturing process flows. Thus, semiconductor chip manufacturers trade off the number and types of circuit elements that can be manufactured from a chip with the number of chips that can be obtained from a semiconductor wafer to lower manufacturing costs.

Another drawback with manufacturing a passive circuit element, an active circuit element, or monolithically integrating passive and active circuit elements in a semiconductor chip is that the circuit elements may become damaged or their performance may be degraded by the processing steps. For example, once a Metal-Insulator-Metal ("MIM") capacitor has been manufactured, subsequent processing steps may damage the MIM capacitor.

Accordingly, it would be advantageous to have circuit elements and a method for manufacturing circuit elements that protects them from subsequent processing steps. In addition, it would be advantageous for the circuit element and method for manufacturing the circuit element to be time and cost efficient.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Generally, the present invention provides a circuit element such as, for example, an MIM capacitor and a method for manufacturing the circuit element. In accordance with one embodiment of the present invention, a method for manufacturing an energy storage device comprises forming a first dielectric material over a substrate followed by forming a first conductive material over the first dielectric material and forming a second dielectric material over the first conductive material. Then a second conductive material is formed over the second dielectric material, wherein the second conductive material has a surface and opposing edges and serves as a capacitor electrode. The capacitor electrode is also referred to as a capacitor plate. A protective layer is formed over the surface, over the opposing edges, and over the portions of the dielectric material that are adjacent to the capacitor electrode. The protective layer extends laterally away from the capacitor electrode.

In accordance with another embodiment the present invention comprises a method for manufacturing an MIM capacitor that includes forming an insulating material between two layers of electrically conductive materials, wherein at least one of the electrically conductive layers has a surface and a plurality of edges, and wherein a portion of the insulating material is exposed. Each electrically conductive layer serves as an electrode or plate of the MIM capacitor. An insulating barrier layer is formed on one of the electrodes, wherein the insulating barrier layer extends along the surface of the electrode and extends to portions of the dielectric material that are laterally adjacent to the electrode.

In accordance with another embodiment of the present invention an MIM capacitor is provided that includes a dielectric material between a pair of electrodes or plates, wherein one of the pair of electrodes is covered by a protective layer.

Figure 1:
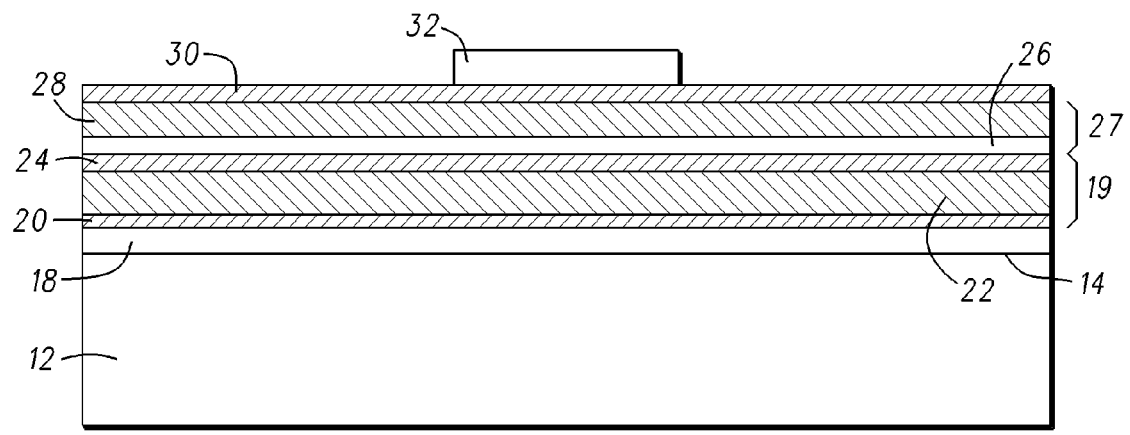
FIG. 1 is a cross-sectional view of a metal-insulator-metal capacitor at an early stage of manufacture in accordance with an embodiment of the present invention.

FIG. 1 is a cross-sectional view of a portion of an MIM capacitor 10 at an early stage of manufacture in accordance with an embodiment of the present invention. What is shown in FIG. 1 is a substrate 12 having a major surface 14. By way of example, substrate 12 is silicon doped with an impurity material or a dopant of P-type conductivity such as, for example, boron, to have a resistivity that ranges from about 0.0001 Ohm-centimeters (Ω-cm) to about 10,000 Ω-cm. Although substrate 12 may be a high resistivity substrate, the resistivity or dopant concentration of substrate 12 is not a limitation of the present invention. Likewise, the type of material for substrate 12 is not limited to being silicon and the conductivity type of substrate 12 is not limited to being P-type conductivity. It should be understood that an impurity material is also referred to as a dopant, an impurity species, or a carrier. Other suitable materials for substrate 12 include polysilicon, germanium, silicon germanium, Semiconductor-On-Insulator ("SOI") material, and the like. In addition, substrate 12 can be comprised of a compound semiconductor material such as Group III-V semiconductor materials, Group II-VI semiconductor materials, etc.

A layer of dielectric material 18 having a thickness ranging from about 1,000 Angstroms (Å) to about 60,000 Å is formed on surface 14. In accordance with one embodiment, dielectric material 18 is formed by the decomposition of tetraethylorthosilicate ("TEOS") to form an oxide layer having a thickness of about 8,000 Å. A dielectric layer formed in this manner is typically referred to as a TEOS layer. The type of material and the thickness of dielectric layer 18 are not limitations of the present invention. It should be noted that a dielectric material may also be referred to as an insulating material or an electrically insulating material.

A conductive material 19 is formed over dielectric layer 18. In accordance with an embodiment of the present invention, conductive material 19 comprises a barrier metal layer 20, a metal layer 22, and a barrier metal layer 24. More particularly, barrier metal layer 20 is formed on dielectric layer 18, metal layer 22 is formed on barrier metal layer 20, and a barrier metal layer 24 is formed on metal layer 22. Barrier metal layer 20 may be, for example, titanium nitride having a thickness ranging from about 75 Å to about 600 Å and metal layer 22 may be a layer of aluminum having a thickness ranging from about 5,000 Å to about 40,000 Å. By way of example, aluminum layer 22 has a thickness of about 20,000 Å. Barrier metal layer 24 may be, for example, titanium nitride having a thickness ranging from about 400 Å to about 900 Å. Layers 20, 22, and 24 may be formed using Chemical Vapor Deposition ("CVD"), Plasma Enhanced Chemical Vapor Deposition ("PECVD"), sputtering, evaporation, or the like. It should be understood that the materials of layers 20, 22, and 24 are not limitations of the present invention. Other suitable materials for barrier metal layers 20 and 24 include titanium, tantalum nitride, a combination of tantalum and tantalum nitride, tungsten, tungsten nitride, titanium silicon nitride, platinum, a metal nitride doped with carbon, a metal nitride doped with silicon, and refractory metal compounds such as refractory metal nitrides, refractory metal carbides, refractory metal borides, or the like. Alternatively, barrier metal layers 20 and 24 may be comprised of bimetallic layers such as, for example, a titanium nitride layer formed on a titanium layer. In this alternative embodiment, a titanium layer may be formed on dielectric layer 18, aluminum layer 20, or both dielectric layer 18 and aluminum layer 20 followed by forming a titanium nitride layer on the titanium layers formed on dielectric layer 18 and aluminum layer 20. Although conductive material 19 has been described as comprising a plurality of layers of conductive material, this is not a limitation of the present invention. More particularly, conductive material 19 may be a single layer of conductive material or two or more layers of conductive material.

A layer of dielectric material 26 such as, for example, silicon nitride having a thickness ranging from about 400 Å to about 2,500 Å is formed above titanium nitride layer 24. Other suitable materials for dielectric layer 26 include silicon dioxide, tantalum oxide, dielectric materials having a high dielectric constant, i.e., a dielectric constant greater than about 3.9, materials having a low dielectric constant, i.e., a dielectric constant less than about 3.9, etc. A conductive material 27 is formed on dielectric material 26. In accordance with one embodiment, conductive material 27 comprises a barrier metal layer 30 disposed on a metal layer 28, which is disposed on dielectric layer 26. More particularly, metal layer 28 comprises aluminum having a thickness ranging from about 500 Å to about 4,000 Å and barrier metal layer 30 has a thickness ranging from about 600 Å to about 1,200 Å. Suitable materials for barrier metal layer 30 are similar to those for barrier metal layers 20 and 24. Like conductive material 19, conductive material 30 has been described as comprising a plurality of layers of conductive material. This is not a limitation of the present invention. Conductive material 30 may be a single layer of conductive material or two or more layers of conductive material. A layer of photoresist is formed on barrier metal layer 30 and patterned to leave at least one portion of barrier metal layer 30 exposed and to leave at least one portion of barrier metal layer 30 protected by photoresist. The portion of the photoresist layer that remains after patterning the layer of photoresist serves as a masking structure 32.

Figure 2:
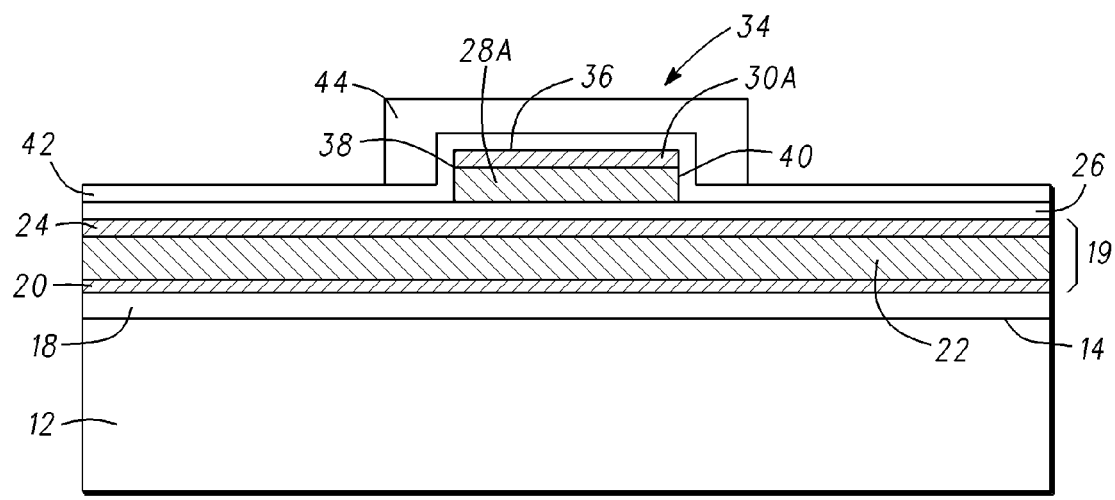
FIG. 2 is a cross-sectional view of the metal-insulator-metal capacitor of FIG. 1 at a later stage of manufacture.

Referring now to FIG. 2, the exposed portions of barrier metal layer 30 and the portions of aluminum layer 28 that are under the exposed portions of barrier metal layer 30 are anisotropically etched using, for example, a reactive ion etch. Dielectric layer 26 serves as an etch stop layer. Thus, etching aluminum layer 28 exposes portions of dielectric layer 26. The remaining portions 30A and 28A of barrier metal layer 30 and aluminum layer 28, respectively, form an electrode 34 of MIM capacitor 10. Electrode 34 has a surface 36 having a surface area and edges 38 and 40. Because MIM capacitor 10 is manufactured over a substrate and may be integrated with other circuit elements, electrode 34 is referred to as a top electrode, a top plate, or an upper electrode. It should be noted that the other circuit elements may be active elements, passive elements, or a combination of active and passive circuit elements.

A protective layer 42 having a thickness ranging from about 25 Å to about 600 Å is formed on the exposed portions of dielectric layer 26, adjacent to edges 38 and 40, and on or along surface 36. By way of example, protective layer 42 is a TEOS layer. It should be noted that the type of material for protective layer 42 is not limited to being a TEOS layer. Alternative materials for protective layer 42 include silicon dioxide, silicon nitride, aluminum oxide, or the like. The silicon dioxide may be formed using a deposition process such as a silane based plasma enhanced chemical vapor deposition ("PECVD") technique or other silicon dioxide deposition process. A layer of photoresist is formed on protective layer 42 and patterned to expose the portions of protective layer 42 that are laterally adjacent to and laterally spaced apart from edges 38 and 40 of electrode 34. Patterning the photoresist layer leaves a portion of the photoresist layer over electrode 34 and over the portions of protective layer 42 that are laterally adjacent to and laterally spaced apart from edges 38 and 40. The portion of the photoresist layer that remains after patterning serves as a masking structure 44.

Figure 3:
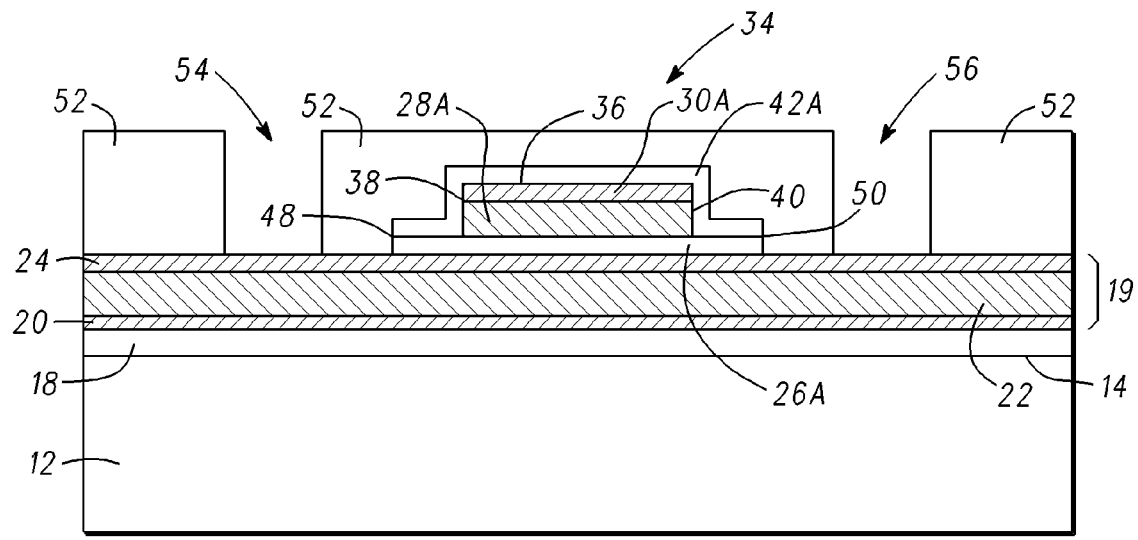
FIG. 3 is a cross-sectional view of the metal-insulator-metal capacitor of FIG. 2 at a later stage of manufacture.

Referring now to FIG. 3, the exposed portions of protective layer 42 and the portions of dielectric layer 26 that are under the exposed portions of protective layer 42 are anisotropically etched using, for example, a reactive ion etch. Barrier metal layer 24 serves as an etch stop layer. Etching protective layer 42 and dielectric layer 26 leaves portion 42A of protective layer 42, portion 26A of dielectric layer 26, and exposes portions of barrier metal layer 24. Portion 42A may also be referred to as a protective layer and portions 42A and 26A have edges 48 and 50 that are laterally spaced apart from edges 38 and 40, respectively. Portion 42A protects electrode 34 from attack by reactants used during subsequent processing steps. Masking structure 44 is removed and a layer of photoresist is formed on portion 42A of protective layer 42 and on the exposed portions of barrier metal layer 24. The layer of photoresist is patterned to form masking structures 52 having openings 54 and 56 that expose portions of barrier metal layer 24 on opposite sides of electrode 34. Openings 54 and 56 are laterally spaced from edges 48 and 50, respectively.

Figure 4:
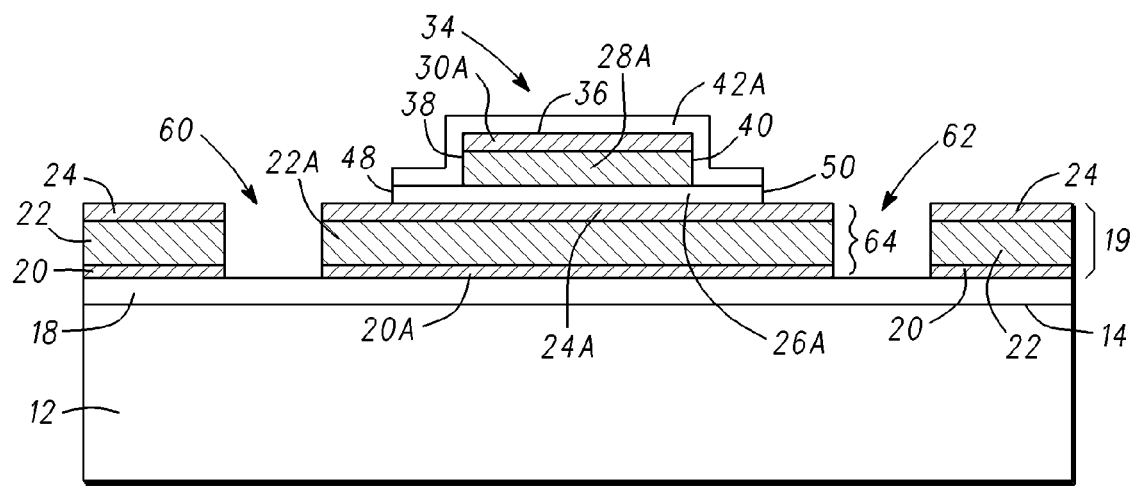
FIG. 4 is a cross-sectional view of the metal-insulator-metal capacitor of FIG. 3 at a later stage of manufacture.

Referring now to FIG. 4, the exposed portions of barrier metal layer 24 and the portions of aluminum layer 22 and barrier metal layer 20 that are under the exposed portions of barrier metal layer 24 are anisotropically etched using, for example, a reactive ion etch to form openings 60 and 62 that expose portions of dielectric layer 18. Dielectric layer 18 serves as an etch stop layer. Openings 60 and 62 are laterally spaced apart from edges 48 and 50, respectively. The anisotropic etch removes the portions of barrier metal layer 24, aluminum layer 22, and barrier metal layer 20 and electrically isolates portions 22A and 20A of aluminum layer 22 and metal-barrier layer 20 from the remaining portions of aluminum layer 22 and metal-barrier layer 22, respectively. The anisotropic etch also electrically isolates portion 24A of barrier metal layer 24 from the remaining portions of barrier metal layer 24. Portions 24A, 22A, and 20A form an electrode 64 of MIM capacitor 10. Electrode 64 is referred to as a bottom electrode, a lower electrode, or a bottom plate because it is between substrate 12 and electrode 34. It should be noted that electrode 64 has a surface area that is larger than the surface area of electrode 34 and that the surface area of portion 26A of dielectric layer 26 is greater than that of electrode 34 but preferably less than that of electrode 64. Because the thickness of masking structure 52 is thinner over top electrode 34 than over barrier metal layer 24, the portion of masking structure 52 over top electrode 34 may be entirely consumed. Thus, portion 42A of protective layer 42 can serve as a hard mask during the formation of bottom electrode 64 and prevent top electrode 34 from being consumed. Preferably, bottom electrode 64 is formed after top electrode 34 and dielectric material 26 to decrease topographic features that may be created by the etches used in forming bottom electrode 64. That is, it is desirable to form top electrode 34 before bottom electrode 64 because the topography or topographic features of patterned bottom or lower electrode 64 and other metal layers increases the complexity of depositing and subsequently removing barrier metal layer 30 and aluminum layer 28 of top electrode 34 as well as dielectric layer 26. Masking structures 52 are removed.

Figure 5:
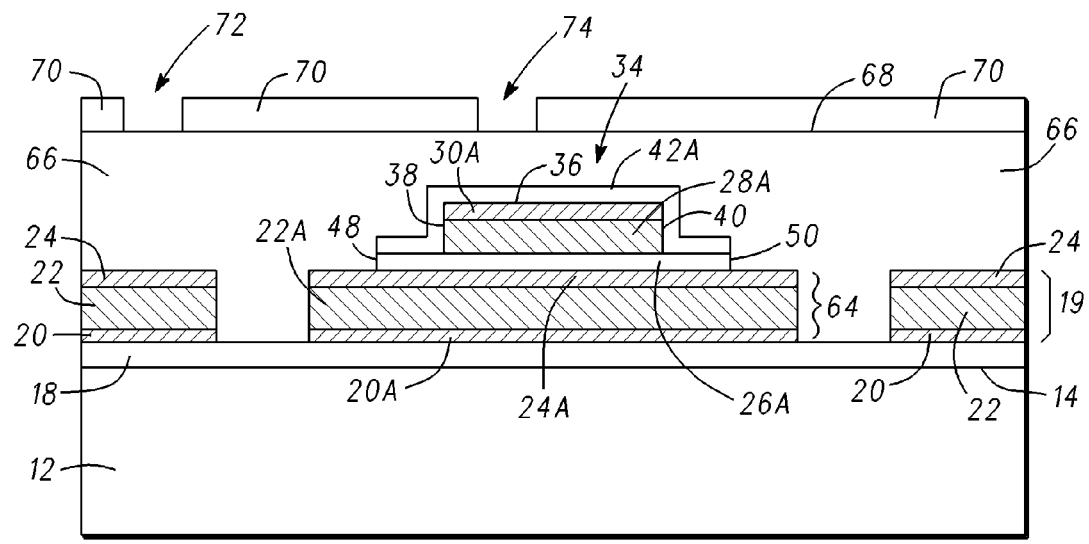
FIG. 5 is a cross-sectional view of the metal-insulator-metal capacitor of FIG. 4 at a later stage of manufacture.

Referring now to FIG. 5, a layer of dielectric material 66 having a thickness ranging from about 5,000 Å to about 50,000 Å is formed on the portion 42A of protective layer 42 and on the exposed portions of barrier metal layer 24 and in openings 60 and 62. Dielectric layer 66 has a surface 68. Dielectric layer 66 may be planarized using planarization techniques such as, for example, chemical mechanical planarization ("CMP"), etch back and deposition, or other methods used to reduce the topography or topographic features of a surface like surface 68 of dielectric layer 66. It should be noted that planarizing dielectric layer 66 is optional, i.e., dielectric layer 66 may not be planarized. A layer of photoresist is formed on surface 68 and patterned to form masking structures 70 having openings 72 and 74 that expose portions of surface 68. Openings 72 and 74 expose portions of surface 68 over top electrode 34 and over a remaining portion of aluminum layer 22 that is laterally spaced apart from MIM capacitor 10.

Figure 6:
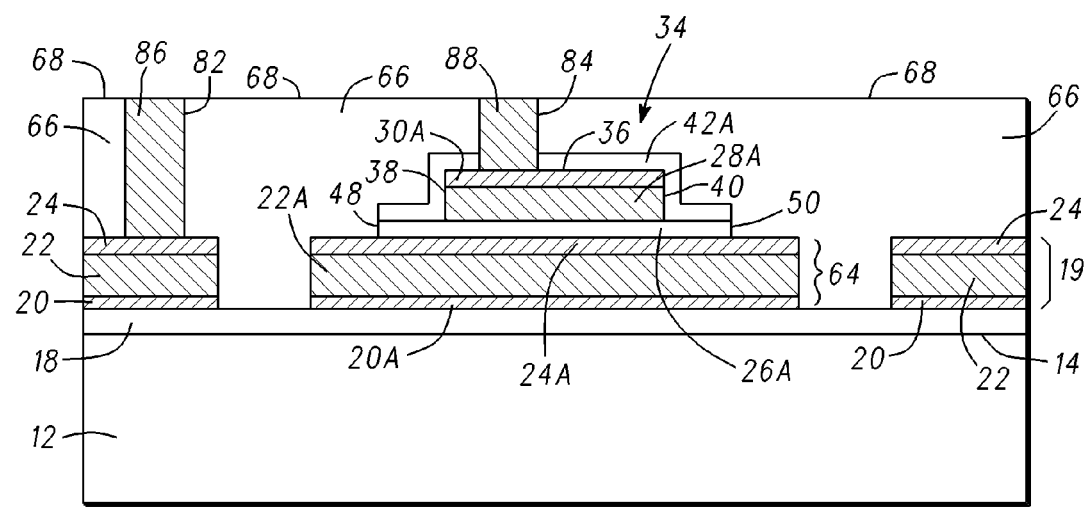
FIG. 6 is a cross-sectional view of the metal-insulator-metal capacitor of FIG. 5 at a later stage of manufacture.

Referring now to FIG. 6, the exposed portions of dielectric layer 66 and the portion of protective layer 42A below the exposed portions of dielectric layer 66 are anisotropically etched using, for example, a reactive ion etch to form contact openings 82 and 84 that expose portions of metallic layer 24 and electrode 34. Metallic layer 24 and electrode 34 serve as etch stop layers. The anisotropic etch removes the portions of dielectric layer 66 and protective layer 42A to form contact openings 82 and 84. Electrical contacts 86 and 88 are formed in contact openings 82 and 84, respectively. Contact 86 allows routing of the electrical signal to other circuits that may be manufactured from substrate 12 and contact 88 forms an electrical contact to electrode 34 of MIM capacitor 10. It should be noted that electrical contact to electrode 64 may be made to another portion of electrode 64. As those skilled in the art are aware, contacts 34 and 64 of MIM capacitor 10 can be electrically connected to other passive circuit elements or to active circuit elements formed on a semiconductor chip through a metallization system.

By now it should be appreciated that an MIM capacitor and a method for manufacturing the MIM capacitor have been provided. An advantage is that a protective layer is included that serves as a hard mask and protects an MIM capacitor electrode from process gases and chemical attack. This allows for manufacturing an MIM capacitor with more controlled and predictable critical dimensions and with smoother etched surfaces. It should be noted that the MIM capacitor may be formed at any metallization level. In other words, in some embodiments a first metal layer may serve as a bottom capacitor plate, in other embodiments a second layer of interconnect metallization may serve as the bottom capacitor plate, in yet other embodiments a third layer of interconnect metallization may serve as the bottom capacitor plate, in other embodiments a fourth layer of interconnect metallization may serve as the bottom capacitor plate, etc. In these embodiments, a metal layer above the bottom capacitor plate serves as a top capacitor plate.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing an energy storage device, comprising:
    providing a first dielectric material;
    forming a first conductive material over the first dielectric material, the first conductive material having a surface;
    forming a second dielectric material over the first conductive material;
    forming a second conductive material over the second dielectric material;
    patterning a first layer of photoresist on the second conductive material to form a first photoresist masking structure over the second conductive material, wherein patterning the first layer of photoresist leaves portions of the second conductive material laterally adjacent the first photoresist masking structure exposed;
    removing exposed portions of the second conductive material that are laterally adjacent the first photoresist masking structure to form an electrode having a surface and opposing edges, wherein removing exposed portions of the second conductive material exposes portions of the second dielectric material;
    forming a protective layer on the surface and opposing edges of the electrode and the exposed portions of the second dielectric material that are laterally adjacent to the opposing edges;
    patterning a second layer of photoresist over the protective layer to form a second photoresist masking structure over the electrode, wherein the second photoresist masking structure has edges that are laterally spaced apart from portions of the protective layer that are over the opposing edges of the electrode, and wherein patterning the second layer of photoresist exposes portions of the protective layer that are laterally spaced apart from the electrode;

removing the exposed portions of the protective layer and the portions of the second dielectric material to expose portions of the first conductive material, wherein portions of the protective layer over the surface of the electrode and along the edges of the electrode remain and serve as a protective material;

patterning a third layer of photoresist over the protective material, the patterned third layer of photoresist having an opening that exposes a portion of the first conductive material; and removing the exposed portion of the first conductive material so that the first conductive material has at least one sidewall and a portion of the first dielectric material is exposed.

2. The method of claim 1, wherein forming the protective layer over the surface includes depositing a layer of oxide over the surface and the opposing edges of the electrode and the exposed portions of the second dielectric material that are adjacent to the opposing edges.

3. The method of claim 1, further including:
forming a fourth dielectric material over the first conductive material, the protective layer, and the exposed portion of the first dielectric material;
exposing a portion of the electrode; and
forming an electrical contact to the exposed portion of the electrode.

4. The method of claim 1, wherein forming the first conductive material comprises:
forming a first barrier layer over the first dielectric material;
forming a first layer of electrically conductive material over the first barrier layer; and
forming a second barrier layer over the first layer of electrically conductive material.

5. The method of claim 4, wherein forming the second conductive material comprises:
forming a second layer of electrically conductive material over the second dielectric material; and
forming a third barrier layer over the second layer of electrically conductive material.

6. The method of claim 1, wherein forming the second conductive material over the second dielectric material comprises:
forming a first layer of aluminum over the second dielectric material; and
removing a portion of the first layer of aluminum to leave an aluminum portion having the opposing edges and to form the exposed portions of the second dielectric material.

7. The method of claim 6, further including:
forming a fourth dielectric material over the first conductive material, the protective layer and the exposed portion of the first dielectric material;
exposing a portion of the electrode; and
forming an electrical contact to the exposed portion of the electrode.

8. The method of claim 6, further including forming a barrier metal layer over the aluminum portion, wherein the barrier metal layer is between the aluminum portion and the protective layer.

9. The method of claim 8, wherein forming a first conductive material comprises:
forming a second layer of aluminum over the first dielectric material; and
forming a barrier metal layer over the second layer of aluminum.

10. The method of claim 9, wherein a metal of the barrier metal layer is titanium nitride.

11. A method for manufacturing a metal-insulator-metal capacitor, comprising:
forming a first electrically conductive material over a first insulating material;
forming a second insulating material over the first electrically conductive material;
forming a second electrically conductive material over the second insulating material;
patterning a first layer of photoresist on the second electrically conductive material to form a first masking structure over the second electrically conductive material, wherein patterning the first layer of photoresist leaves portions of the second electrically conductive material adjacent the first masking structure exposed;
removing the exposed portions of the second electrically conductive material that are laterally adjacent the first masking structure to form an electrode having a surface and opposing edges, wherein patterning the first layer of photoresist exposes portions of the second electrically conductive material adjacent the first masking structure;
forming an insulating barrier layer over the electrode, wherein the insulating barrier layer extends along the surface and along the exposed portion of the second insulating material adjacent the opposing edges of the electrode;
patterning a second layer of photoresist over the insulation barrier layer to form a second masking structure over the electrode, wherein the second masking structure has edges that are laterally spaced apart from portions of the insulating barrier layer that are over the opposing edges of the electrode, and wherein patterning the second layer of photoresist exposes portions of the insulating barrier layer that are laterally spaced apart from the electrode;
removing the exposed portions of the insulating barrier layer and the portions of the second insulating material to expose portions of the first electrically conductive material, wherein portions of the protective layer over the surface of the electrode and along the edges of the electrode remain and serve as a protective material;
patterning a third layer of photoresist over the protective material, the patterned third layer of photoresist having an opening that exposes a portion of the first electrically conductive material; and
removing a portion of the first electrically conductive material to expose a portion of the first insulating material after forming the insulating barrier layer, wherein removing the portion of the first electrically conductive material forms at least one edge from the first electrically conductive material.

12. The method of claim 11, wherein forming the first electrically conductive material comprises:
forming a first layer of aluminum over the first insulating material; and
forming a first barrier metal layer over the first layer of aluminum.

13. The method of claim 12, wherein forming the second insulating material over the first electrically conductive material comprises forming silicon nitride as the second insulating material.

14. The method of claim 12, wherein forming the second electrically conductive material over the second insulating material comprises:
forming a second layer of aluminum on the second insulating material;

forming a second barrier metal layer on the second layer of aluminum, the second barrier metal of the second barrier metal layer selected from the group of barrier metals comprising titanium nitride, titanium, tantalum nitride, a combination of tantalum and tantalum nitride, tungsten, tungsten nitride, titanium silicon nitride, platinum, a metal nitride doped with carbon, a metal nitride doped with silicon, and refractory metal compounds; and removing a portion of the second barrier metal layer and the second layer of aluminum to expose a portion of the second insulating material.

15. The method of claim 14, wherein the barrier metal of the second barrier metal layer is titanium nitride.

16. The method of claim 14, wherein forming the insulating barrier layer over the second electrically conductive material comprises depositing oxide as the insulating barrier layer.

17. The method of claim 16, further including:

forming a third insulating material over the exposed portion of the first insulating material, over a portion of the insulating barrier layer and over a portion of the first electrically conductive material.

* * * * *